(12) United States Patent
Hidehira

(10) Patent No.: US 6,624,650 B1
(45) Date of Patent: Sep. 23, 2003

(54) IMPEDANCE MEASURING DEVICE FOR PRINTED WIRING BOARD

(75) Inventor: Yorio Hidehira, Okayama (JP)

(73) Assignee: Microcraft KK, Okayama (JP)

(*) Notice: Subject to any disclaimer, the term of this patent is extended or adjusted under 35 U.S.C. 154(b) by 0 days.

(21) Appl. No.: 09/578,878

(22) Filed: May 25, 2000

(30) Foreign Application Priority Data

May 31, 1999 (JP) ............................................ 11-151939

(51) Int. Cl.[7] ......................... G01R 31/26; G01R 31/02
(52) U.S. Cl. ....................... 324/765; 324/754; 324/758
(58) Field of Search ................... 324/754, 758, 324/765

(56) References Cited

U.S. PATENT DOCUMENTS

| | | | |
|---|---|---|---|
| 3,681,682 A | * 8/1972 | Cox et al. | 324/546 |
| 4,731,577 A | * 3/1988 | Logan | 324/754 |
| 4,864,227 A | * 9/1989 | Sato | 324/754 |
| 4,929,893 A | * 5/1990 | Sato et al. | 324/758 |
| 5,196,789 A | * 3/1993 | Golden et al. | 324/761 |
| 5,315,237 A | * 5/1994 | Iwakura et al. | 324/754 |
| 5,755,038 A | * 5/1998 | McMurtry | 33/556 |
| 5,850,147 A | * 12/1998 | Stowers et al. | 324/761 |
| 6,252,391 B1 | * 6/2001 | McAllister et al. | 324/72.5 |
| 6,323,667 B1 | * 11/2001 | Kazama | 324/761 |

FOREIGN PATENT DOCUMENTS

| | | | |
|---|---|---|---|
| JP | 1988-58757 U | 4/1988 | |
| JP | 1989-46755 U | 3/1989 | |
| JP | 03028770 A | 2/1991 | |
| JP | 3146883 A | * 6/1991 | 324/754 |
| JP | 05273305 | 10/1993 | |
| JP | 06094771 A | 4/1994 | |
| JP | 06230060 A | 8/1994 | |
| JP | 09281163 A | 10/1997 | |
| JP | 2001004659 A | * 1/2001 | G01R/1/067 |
| JP | 2001255340 A | * 9/2001 | G01R/1/067 |

* cited by examiner

Primary Examiner—Kamand Cuneo
Assistant Examiner—Jermele Hollington
(74) Attorney, Agent, or Firm—Kilpatrick Stockton LLP

(57) ABSTRACT

It is the object to automatically measure the characteristic impedance of a printed wiring circuit of a printed wiring substrate using a coaxial probe. The present invention provides an impedance measuring device for printed wiring boards that has a test probe driving means such as a coaxial probe which mounts a test probe unit that has a first contact stylus and a second contact stylus provided at a position apart from the first contact stylus by a certain distance with its tip facing the same direction as the first contact stylus. The impedance measuring device has the test probe unit moveable to any point on the board such that the first and second contact styli may be brought into contact with predetermined points of measurement on the board. The impedance measuring device is characterized by having a second contact stylus turning means turns the second contact stylus of the test probe unit mounted around the first contact stylus.

16 Claims, 8 Drawing Sheets

IMPEDANCE MEASURING DEVICE FOR PRINTED WIRING BOARD

FIELD OF THE INVENTION

The invention pertains to a device that automatically measures a characteristic impedance of a printed wiring circuit on a printed wiring board mainly using a coaxial probe.

BACKGROUND OF THE INVENTION

A CPU clock frequency and an operation clock for CPU interaction with external devices recently has been remarkably increased so that a processing speed of a computer or the like may be increased. With the speed increase of the operation clock, the performance requirement for the printed wiring board where a data signal runs also become demanding. By way of example, there is a requirement that the characteristic impedance between printed wiring circuits formed by signal conductors on the printed wiring board need to be matched and that the characteristic impedance and the impedance of the circuit load need to be matched. Without the match, a signal is partially reflected back to a signal source such that the signal transmitted to the load becomes so weak that the data may not be transmitted completely. This problem becomes more serious with an increase of the frequency.

Thus, to maintain the quality of the printed wiring board, it will be essential to measure the characteristic impedance of the printed wiring circuit. Conventionally, the characteristic impedance of the printed wiring circuit is measured manually using a coaxial probe such as illustrated in FIG. 8. A coaxial probe has a center probe (201) and a cylindrical plunger with a protrusion (202) with a sharp tip as a part of the edge, which is provided to surround the center probe (201). It is briefly explained how to use a coaxial probe below. A through-hole that is connected to ground is usually provided around the end of a signal conductor on the printed wiring board that handles high frequency. The impedance of the coaxial probe is set to match the designed impedance of the measured printed circuit. First, the center probe (201) is brought in contact with the end of the signal conductor, and the protrusion (202) is brought in contact with the through-hole. Then, a predetermined high frequency signal is sent from the center probe (201), and the reflected wave signal from the circuit is received by the center probe (201). Now, the protrusion (202) is connected to ground. As the impedance of the coaxial probe and the impedance of the printed wiring circuit are designed to be equal, there should be no reflected wave signal if the circuit was manufactured according to the design. However, if there is deviation in the impedance of the printed wiring circuit from the designed one, the reflected wave is reflected at the part with the deviated impedance. Thus, if the period of time from when the high frequency signal is sent to when the reflected wave returns and the strength or amplitude of the reflected wave are measured, it is determined what level of the impedance deviation is present and at which part.

OBJECT OF THE INVENTION

The operation clocks of equipment connected to computers are expected to increase in speed further in the future. Along with this trend, the need to measure the characteristic impedance to assure the quality of the printed wiring board will increase significantly. Then, the conventional method of manually measuring the impedance of the printed wiring circuit using a coaxial probe may not be good enough. It will be necessary to automate this process. Meanwhile, as a testing device for the printed wiring board, a device with a contact stylus automatically and two-dimensionally moved by a program to be in contact with the testing point of the printed wiring board to conduct a test for a line cut, etc. (hereafter called "an automatic printed wiring board testing device") has been used conventionally. Thus, it is efficient and desirable to move a coaxial probe by means of this automatic printed wiring board testing device to test the testing point on the printed wiring board.

However, if a coaxial probe is fixed to the operating part of automatic printed wiring board testing device, the protrusion (202) may sometimes not be in contact with the through-hole when the center probe (201) is placed in contact with the edge of the signal conductor since the positional relationship between center probe (201) and the protrusion (202) will not be changed and since the position of a through-hole provided on the printed wiring board around the signal conductor is not fixed.

Besides, several different distances between the edge of the signal conductor and the through-hole may be used on the printed wiring board while the distance between the center probe (201) and the protrusion (202) of the coaxial probe is fixed. Thus, they may not match all the time. In some cases, when the center probe (201) is brought into contact with the edge of signal conductor, the protrusion (202) may not be in contact with the through-hole. Therefore, a good measurement may not be performed simply by applying the conventional coaxial probe to the automatic printed wiring board testing device.

The object of the present invention is to provide an impedance measuring device for the automatic measurement of the characteristic impedance of the printed wiring circuit on the printed wiring board principally by loading a coaxial probe in the automatic printed wiring board testing device.

SUMMARY OF THE INVENTION

The present invention seeks to solve the problem so as to provide an impedance measuring device for the printed wiring board that has a test probe unit such as a coaxial probe that includes a first and a second contact styli whose top tips point to the same direction wherein the second contact stylus is placed with a certain distance from the first contact stylus and a test probe driving means for moving the test probe unit to any place over the printed wiring board to be measured in order to make the first and the second contact styli contact certain measuring points on the printed wiring board, wherein the impedance measuring device further comprises a second contact stylus turning means for turning said second contact probe around said first contact stylus.

With this constitution, even when the direction is varied in which the through-hole is provided relative to the edge of signal conductor on the board to be tested, the second contact stylus turning means can turn the second contact stylus to match the direction of the second contact stylus in relation to the first contact stylus toward the direction of the through-hole in relation to the edge of the signal conductor. In this manner the first contact stylus may be brought into contact with the edge of the signal conductor, and at the same time the second contact stylus may be brought into contact with the through-hole so that the impedance of the signal conductor may be measured. Now, the impedance measuring device may be employed to measure the impedance with two styli contacted to two measuring points, although the impedance measuring of the signal conductor is shown as an example that is, the area of use of the device is not limited to the impedance measurement of signal conductors. It can be widely applied to any use wherein contact styli are placed in contact with two points to be measured. In this manner, with the impedance measuring device in accordance with the invention, the measurement can be made even when the direction of a point from the other is varied where the two points are provided for measurement. Therefore, the device can contribute to the realization of an automatic impedance measurement that uses a test probe unit such as a coaxial probe.

The second contact stylus turning means preferably turns the second contact stylus by turning the whole test probe unit around the first contact stylus as the central axis of turning. That is, if only the second contact stylus is designed to turn, a mechanism that enables the second contact stylus to turn independently form the first contact stylus movement needs to be provided in the vicinity of the top end of the test probe unit so that the mechanism must be small. On the other hand, if the whole test probe unit is designed to turn, the second contact stylus may turn around the first contact stylus as the center axis of turning without such a small mechanism as mentioned above.

The present invention further provides the impedance measuring device for the printed wiring board that has the test probe driving means which mounts the test probe unit that has the first contact stylus and the second contact stylus provided at a position apart from the first contact stylus by a certain distance with its tip facing the same direction as the first contact stylus tip, moves the test probe unit to any point over the board to be tested, and makes the first and second contact styli contact predetermined points of measurement on the board to be tested, wherein the impedance measuring device further comprises a replacement contact stylus holding means that holds a replacement second contact stylus for replacement and a contact stylus replacing means that replaces the second contact stylus of the test probe unit mounted on the test probe driving means with the replacement second contact stylus held by the replacement contact stylus holding means.

In an impedance measuring device that has this type of constitution, when the distance is varied between the edge of the signal conductor on the board to be tested and the through-hole, the contact stylus replacing means replaces the second contact stylus with a replacement (a replacement second contact stylus) having a corresponding distance between the first and the replacement second styli to the distance between the edge of the signal conductor and the through-hole as the contact stylus holding means holds the replacement second contact styli for replacement that have the distances from the first contact stylus corresponding to respective distances. In this manner, if the second contact stylus that has a distance corresponding to the distance between the edge of the signal conductor and the through-hole is used, the first contact stylus may be brought into contact with the edge of the signal conductor and at the same time the second contact stylus may be brought into contact with the through-hole so as to measure the impedance of the signal conductor. Now, although here the impedance measurement for signal conductors is taken as an example, it is just an example as mentioned before. In this manner the impedance measuring device in accordance with the present invention can make measurements even when there is more than one distance between two points to be measured. Therefore, it can also contribute to the realization of automatic impedance measurement using the test probe unit.

Furthermore, the replacement contact stylus holding means may have two or more contact stylus grasping means that grasp and release the second contact stylus that are driven by a driving means. The contact stylus replacement means may comprise the test probe driving means, the contact stylus grasping means, and a driving control means that controls the test probe driving means and the driving means for the contact stylus grasping means.

To explain briefly the operation of this example, it is premised that the test probe unit can be attached or detached by applying force to a specific part that contains the second contact stylus in a specific direction and that the replacement second contact stylus used also contains this specific part. First, there are at least one contact stylus grasping means (#1) that is open or empty or does not hold a replacement second contact stylus and one contact stylus grasping means (#2) that holds or grasps a replacement second contact stylus (#B). Then, with the contact stylus replacing means, the driving control means drives the test probe driving means to convey the second contact stylus (#A) of the test probe unit to a position such that it can be grasped by the empty contact stylus grasping means (#1) and that the second contact stylus (#A) is grasped by controlling the driving means of the contact stylus grasping means (#1). As the second contact stylus (#A) is grasped and fixed, the driving control means drives the test probe driving means to a specific direction to remove or detach the second contact stylus (#A) from the test probe unit. Then, the driving control means further drives the test probe driving means to install or attach the replacement second contact stylus (#B) on the test probe unit through a specific operation, where the replacement second contact stylus (#B) is grasped by the contact stylus grasping means (#2). When the replacement second stylus (#B) is installed, the driving control means controls the driving means of the contact stylus grasping means (#2) to open the grasping of the replacement second contact stylus (#B). Thus, the replacement of the second contact stylus (#B) is completed.

By adopting this constitution, as the test probe driving means can be commonly used as a part of the contact stylus replacing means, the structure of the whole device can be further simplified.

Furthermore, it is desirable to install in the impedance measuring device a turning position calibration means that calibrates the installation position in the turning direction of the second contact stylus around the first contact stylus of the test probe unit mounted on a test probe driving means as the central axis of turning. That is, if the installation position in the turning direction of the second contact stylus around the first contact stylus as the central axis of turning is displaced from the reference position, the second contact stylus is not correctly brought into contact with the point of measurement. Thus, it may prevent the device from applying to an automated operation. Also, turning or replacing of the second contact stylus may cause displacement of the installation position in the turning direction of the second contact stylus. Thus, the turning position calibration means can calibrate the installation position in the turning direction of the second contact stylus around the first contact stylus as the central axis of turning when it is needed to make more precise and accurate measurement.

It is premised that the second contact stylus comprises a ring that has a notched or missing part and is installed as the center axis of the ring is aligned to the center axis of the first contact stylus. The turning position calibration means may comprise a reference engaging part, whereby the test probe unit engages with the reference engaging part while the ring having a notched or missing part is inserted when the turning position of the second contact stylus around the first contact stylus is in a reference position.

With such constitution, the turning position of the second contact stylus may be finally adjusted by turning the second contact stylus as the notched part of the second contact stylus is directed to the reference engaging part such that the test probe unit is made to engage with the reference engaging part. In this manner, the calibration of the installation position in the turning direction of the second contact stylus is completed. That is, a turning position calibration means that has such a simple constitution that the position in the turning direction of the second contact stylus around the first contact stylus as the central axis of turning can be calibrated.

Also, the impedance measuring device may comprise a reference resistance that has a reference impedance that can be measured by the test probe unit. Since such reference resistance is installed, the measurement equipment can be tested whether it performs a correct measurement by measuring the reference resistance with the test probe unit when it is needed. Also, if the measurement equipment does not perform a correct measurement, the measurement setting can be adjusted based on the measurement result of this reference resistance in order to resume to perform a correct measurement.

Then, when the turning position calibration means contains a reference engaging part, it is more efficient to enable the test probe unit to measure the reference resistance during a period that the test probe unit engages with the reference engaging part. In this manner, when the test probe unit is engaged with the reference engaging part, both the calibration of the position in the turning direction of the second contact stylus around the first contact stylus as the central axis of turning and the calibration of the measurement equipment can be performed concurrently so that the operation time can be shortened.

A test probe unit may be used that is installed on the impedance measuring device and has an elastic member that pushes the first contact stylus toward the tip end direction. If such test probe unit is used, the impact between them can be mitigated by the elastic member when the first contact stylus hits the board to be tested. This is especially effective when the impedance measurement of the board to be tested is made automatically. Thus, damage and deterioration of the first contact stylus and the board to be tested can be prevented.

Also, the test probe unit that is used for the impedance measuring device equipped with the replacement contact stylus holding means and the contact stylus replacing means may be used whereby the second contact stylus is formed in a manner that can be attached to or detached from the first contact stylus in the longitudinal direction of the first contact stylus. When the test probe unit that has such constitution, only the part that contains the second contact stylus has to be replaced without replacing the first contact stylus. Thus, it is economical. Also, as the second contact stylus can be attached or detached by moving the first contact stylus in the longitudinal direction, the attachment and the detachment of the second contact stylus can be made by an axial directional movement of the first contact stylus. Since the axial directional movement is applied for the regular measurement by the test probe unit, no special mechanism for the operation is needed.

As mentioned earlier, the test probe unit used for the impedance measuring device with the turning position calibration means containing the reference engaging part may further have the ring with the notched part that engages with the reference engaging part. The test probe unit may be integrally installed with the second contact stylus and the ring having the central axis matched with that of the first contact stylus. Since this operation is the same as mentioned earlier, it is omitted here. By providing a simple structure for the test probe unit, the second contact stylus can be calibrated in the turning direction around the first contact stylus as the central axis of turning. Now, needless to say, the shape and the number of notches on the ring provided on the second contact stylus can be arbitrarily modified based on the needs.

DETAILED DESCRIPTION OF PREFERRED EMBODIMENT

Figure 1:
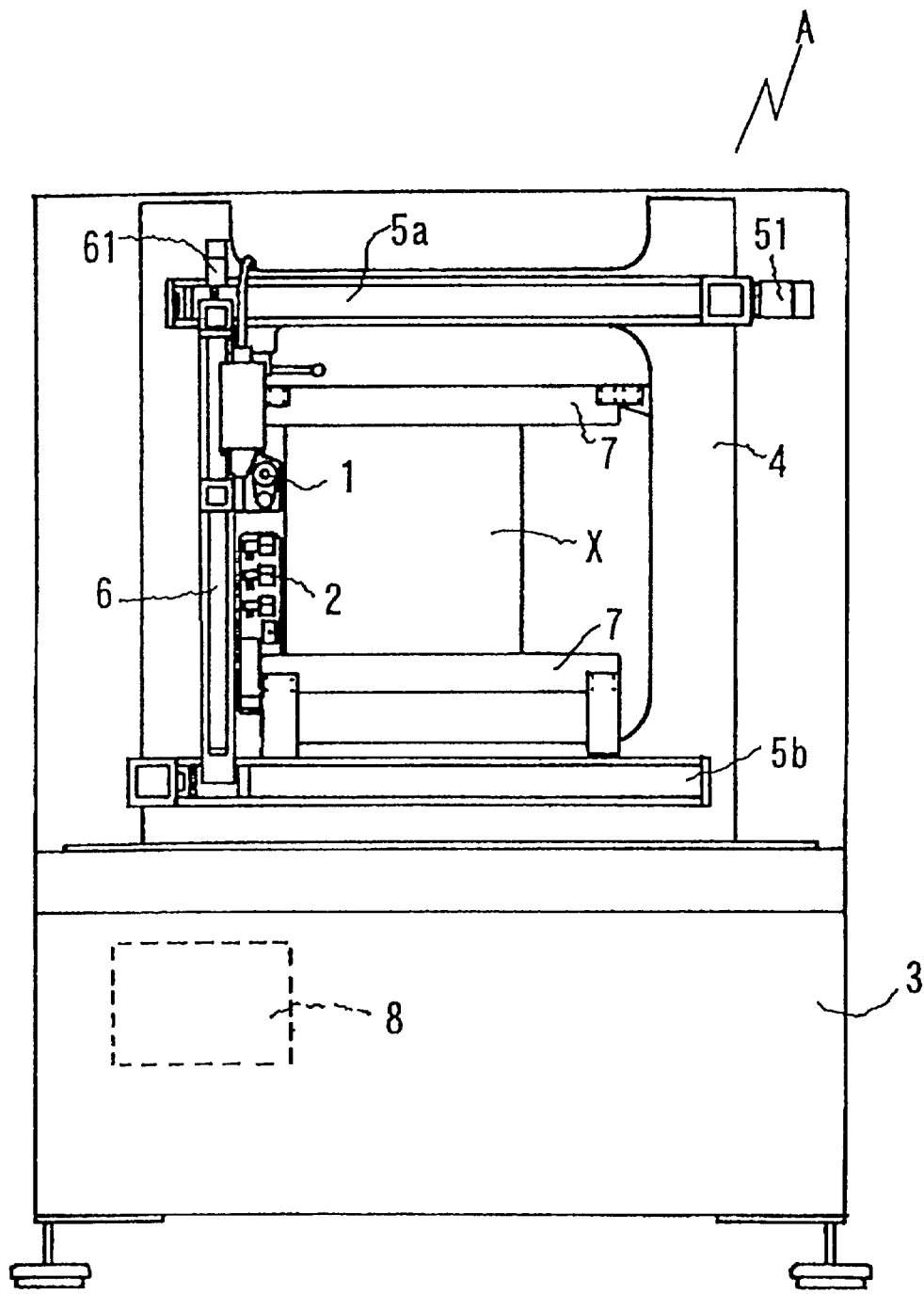
FIG. 1 is a front view that illustrates the outline of the impedance measuring device in accordance with the present invention.

Next, the preferred embodiment of the invention will be explained in reference to the figures. FIG. 1 illustrates a front view that expresses the outline of an impedance measuring device (A) for a printed wiring board in accordance with the present invention. In this impedance measuring device (A), a frame (4) is fixed inside of the body (3). In the respective upper and lower vicinity of this frame (4), X-direction rails (5a) and (5b) are horizontally fixed. Furthermore, on the X-direction rails (5a) and (5b), a Y-direction rail (6) is provided which is secured in a manner that it can move along the longitudinal direction of the X-direction rails (5a) and (5b). A probe unit (1) is provided on this Y-direction rail (6), which is secured in a manner that it can move along the longitudinal direction of the Y-direction rail (6). These X-direction rails (5a) and (5b), Y-direction rail (6), and probe unit (1) constitute the test probe driving means. Furthermore, a probe holding unit (2) that holds the coaxial probe, which is the test probe unit, and the board holding clamps (7), (7) that grasp the printed wiring board (X) to be measured are fixed on the frame (4). A control part (8) is provided in the lower part of the inside of the body (3).

On the X-direction rail (5a), a ball screw, which is not illustrated and is driven to turn by a servomotor (51), is provided along the longitudinal direction. The upper edge of the Y-direction rail (6) is fixed to the working part of this ball screw. A ball screw, which is not illustrated and is driven to turn by a servomotor (61), is also provided on the Y-direction rail (6) along the longitudinal direction. The probe unit (1) is fixed to the working part of this ball screw. These servomotors (51) and (61) are controlled by the control part (8), thereby, the probe unit (1) can be constituted to move to any position in the movable plane between the X-direction rails (5a) and (5b).

Figure 2:
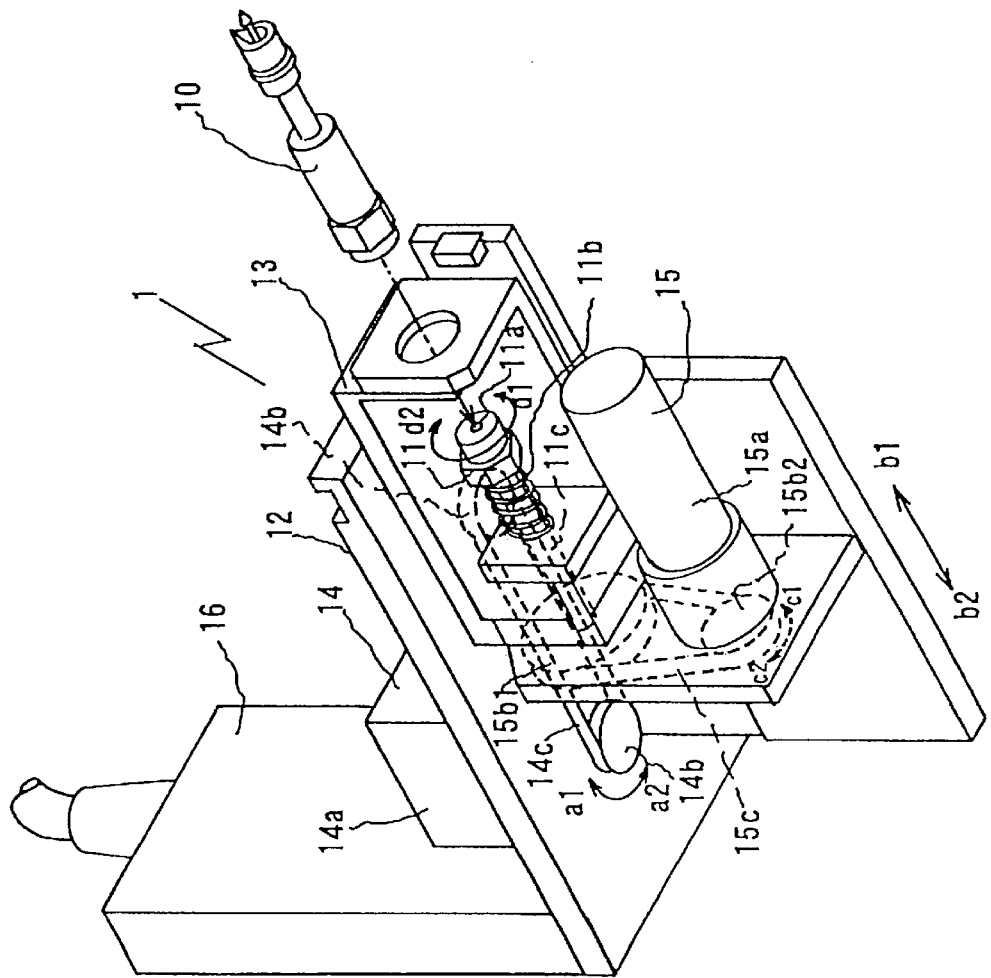
FIG. 2 is an oblique view that illustrates the probe unit used in the impedance measuring device illustrated in FIG. 1.

Next, the probe unit (1) will be explained in detail. FIG. 2 illustrates an oblique view of the probe unit (1). The probe unit (1) mounts (to be used) a coaxial probe (10) which is the test probe. The probe unit (1) is comprised of a base (12) fixed to the working part of the ball screw (not shown) in the Y-direction rail; a connector holder (13) secured to the base (12) in a manner such that it can slide perpendicularly to the plane that constitutes the printed wiring board (X) which is fixed by board holding clamps (7), (7); a rod-like connector (11) that mounts and is electrically connected to a coaxial probe (10) and is secured to a connector holder (13) in a manner such that it can slide in the longitudinal direction; a sliding movement motor unit (14) fixed to the base (12); and a measurement unit (16) that is fixed to the base (12), transmits a measurement signal to the board through the coaxial probe (10) connected to the connector (11), and receives a reflected wave of the transmitted measurement signal.

The sliding movement motor unit (14) is comprised of a stepping motor (14a), pulleys (14b), (14b), which are provided along the sliding direction of the connector holder (13), and a belt (14c), which is set between the pulleys (14b) and (14b). One of the pulleys (14b) and (14b) is driven to turn by the stepping motor (14a), and a part of the belt (14c) is fixed to the connector holder (13). Therefore, when the stepping motor (14a) turns the pulleys (14b), (14b) and moves the belt (14c) in the direction of arrow (a1–a2), the connector holder (13) secured to the base (12) in a manner that the connector holder (13) can slide on the base (12) slides to the direction of arrow (b1–b2) in response to the belt movement. As the coaxial probe (10) is mounted to the connector (11), which is provided on the connector holder (13), the stepping motor (14a) can move the coaxial probe (10) in a direction perpendicular to the plane that constitutes the board (X) to be tested, which is held by the board holding clamps (7), (7). Thus, the coaxial probe (10) movement can be controlled.

The turning motor unit (15) is comprised of a servomotor (15a) that turns around an rotation axis parallel to the longitudinal direction of the connector (11), a pulley (15b1) that has the common center axis.with the connector (11), a pulley (15b2) that is directly connected to the servomotor (15a), and a belt (15c) that applies between the pulleys (15b1) and (15b2). The main body (11c) of the connector (11) is secured to the pulley (15b) such that it can slide in the longitudinal direction but cannot turn. When the pulley (15b2) is turned to the direction of arrow (c1–c2) by means of the servomotor (15a), the connector (11) secured to the pulley (15b1) correspondingly turns in the direction of arrows (d1–d2). Because the coaxial probe (10) is mounted to the connector, it can be turned and the angle of rotation can be controlled by turning and controlling the servomotor (15a).

The rear edge of the coaxial probe (10) constitutes a male connector as described later. A female connector (11a) that engages with the male connector of this coaxial probe (10) is formed at the tip of the connector (11). Furthermore, this female connector (11a) is pressed toward the tip direction by the spring (11b). When a force from the tip toward the rear is applied to the coaxial probe (10), which is mounted to the connector (11), the main body (11c) slides in the direction of the applied force and the spring (11b) regulates the movement to mitigate the impact as the main body (11c) of the connector (11) is secured such that it can slide in the longitudinal direction. Although it is not shown in the figures, the female connector (11a) is electrically connected to the signal input-output terminal of the measurement unit (16). Furthermore, the measurement unit (16) is connected to a computer terminal unit, which is not shown, and the result of such measurement is recorded by this computer terminal unit.

Figure 3:
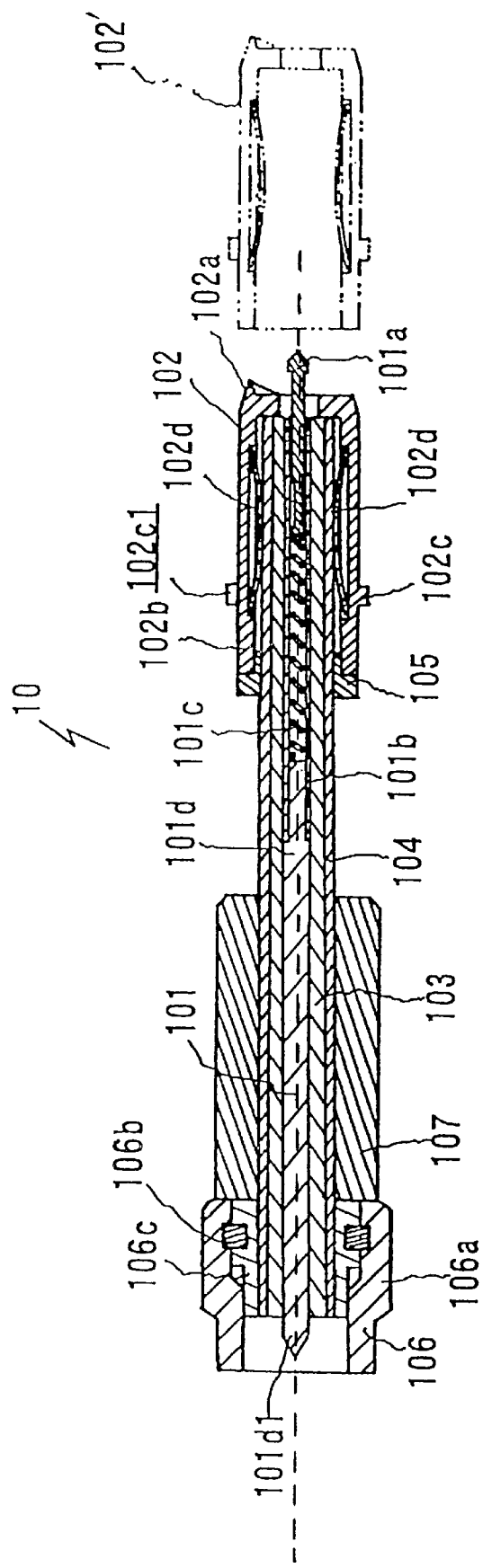
FIG. 3 is a vertical cross-sectional view of the coaxial probe in accordance with the present invention.

Next, the coaxial probe (10) mounted to the probe unit (1) will be explained in detail. FIG. 3 illustrates a vertical cross-sectional view of the coaxial probe (10). In the figure the right edge is the tip of the coaxial probe (10). The coaxial probe (10) is comprised of a rod-like center probe (101), a tube-like insulator (103) formed of an insulating substance that fits around the peripheral face of the center probe (101), an outer tube (104) formed of conductive material that fits around the peripheral face of the insulator (103), a cylindrical plunger (102) that fits around the peripheral face on the tip side of the outer tube (104), a stopper (105) that engages with the opening part at the rear edge of the plunger (102) and fits around the peripheral face of the outer tube (104), a known male connector (106) composed of parts (106a), (106b) and (106c) on the rear edge side that fits around the peripheral face on the rear edge side of the outer tube, and a cylindrical holder (107), which is provided to be in contact with the male connector (106) on its tip end side and fits around the peripheral face of the outer tube (104).

The center probe (101) further comprises a terminal (101d1) that is formed inside the male connector (106) about the rear edge, a rod-like terminal rod (101d) whose outer diameter is smaller towards the tip end, a tube-like conductor pipe (101) that has the same outer diameter as the terminal rod (101d1) and has the rear edge part that fits to the tip part of the terminal rod (101d) where the outer diameter is smaller, the first contact stylus (101a) with a sharp tip that is provided inside of the conductor pipe (101b) about the tip side such that it can slide, and a compression spring (101c) that mitigates the impact from the tip of the first contact stylus (101a) and is provided between the tip of the terminal rod (101d) and the rear edge of the first contact stylus (101a) inside of the conductor pipe (101b). As the first contact stylus (101a), the conductor pipe (101b), and the terminal rod (101d) are respectively formed of conductive material, the conductivity from the tip of the first contact stylus (101a) to the terminal (101d1) at the rear edge of the terminal rod (101d) is assured.

Figure 4:
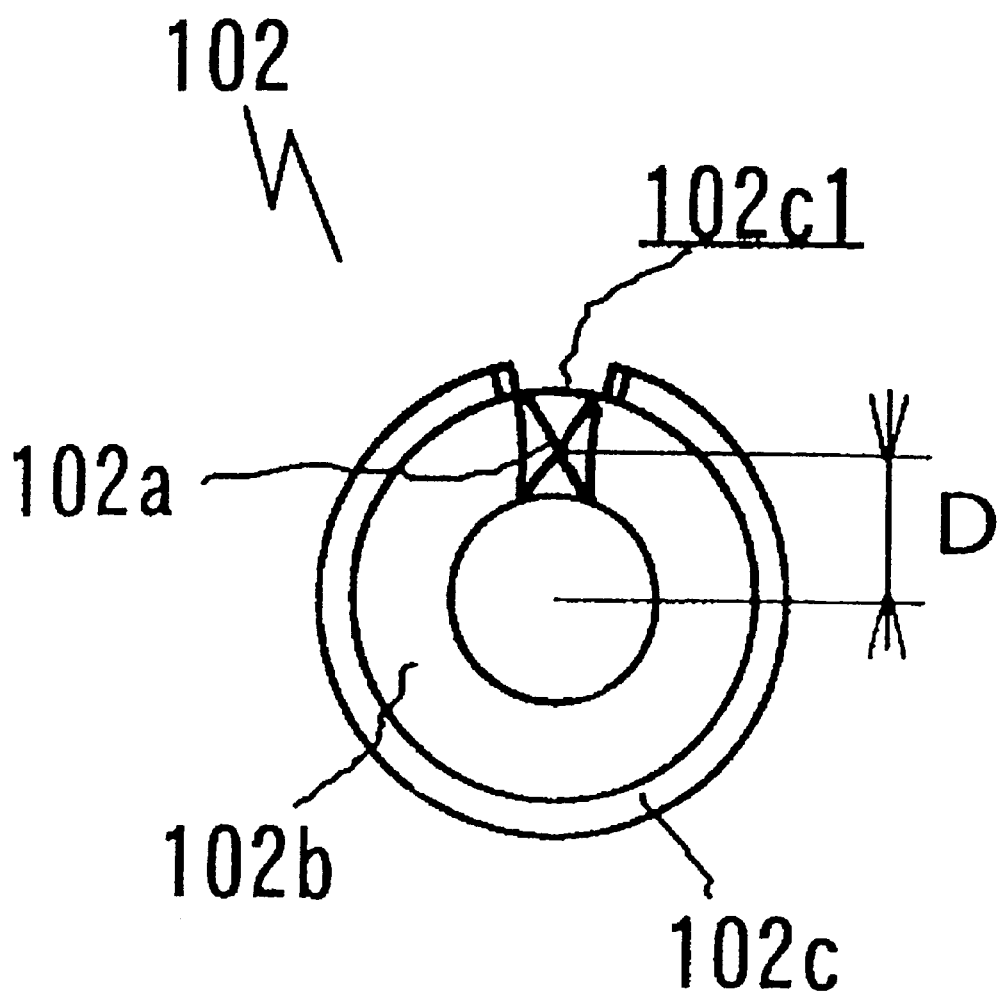
FIG. 4 is a view of the coaxial probe observed from the tip direction in accordance with the present invention.

The plunger (102) is further comprised of a cylindrical main body part (102b), the second contact stylus (102a) composed of a sharp protrusion which is provided at the edge on the tip side of the main body part (102b), a ring-like calibration ring (102c) which is provided around the periphery of the main body part, and a plate spring (102d) which is provided in the inner peripheral face of the main body part (102b) such that it may press the outer peripheral face of said outer tube (104). FIG. 4 illustrates a view of plunger (102) observed from the tip direction. As illustrated in FIG. 4, a notched part (102c1) is formed at a part of the calibration ring (102c). This notch (102c1) is formed such that the width will be narrower from the tip toward the rear in the longitudinal direction of the plunger (102).

As the imaginary line in FIG. 3 indicates, the plunger (102) can be attached or detached in the longitudinal direction of the first contact stylus (101a) of the center probe (101). The plunger (102), stopper (105), outer tube (104), and male connector (106) are respectively formed of conductive material. When the opening part at the rear edge of the plunger (102) is engaged with the stopper (105), conductivity from the second contact stylus (102a) to the male connector (106) is assured. The plunger (102) is formed in this manner so that it can be attached and detached. Thus, the plunger (102) can be replaced with a replacement plunger based on the distance between the edge of signal wire and the through-hole in the board (X) to be tested.

Figure 5:
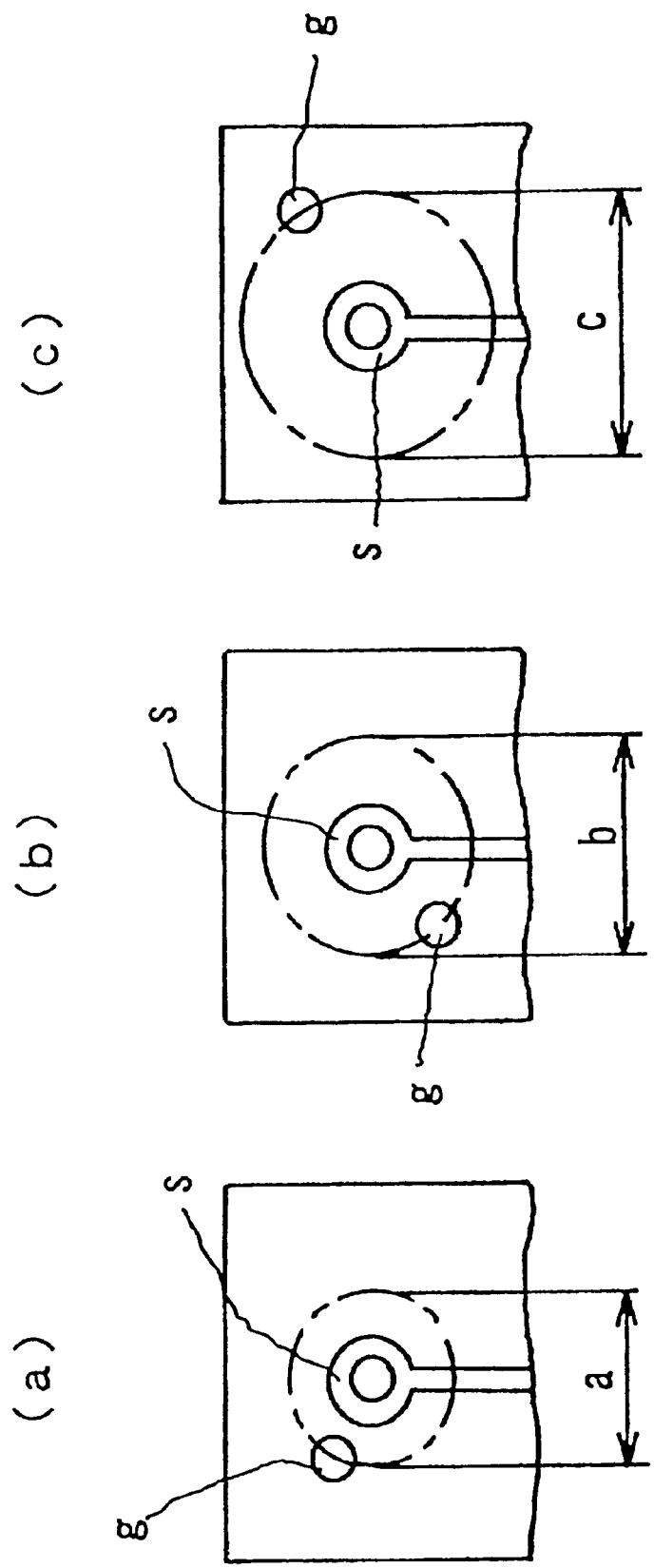
FIG. 5 (a), (b), and (c) all illustrate examples of the vicinity of the signal wire edges of the board (X) to be tested.

FIG. 5 (a), (b), and (c) illustrate examples of the vicinity of the edge of signal wire in the board (X) to be tested. In general there are various distances between the signal wire edge (s) and the through-hole (g) connected to ground. However, the types are mostly fixed. FIG. 5 (a), (b), and (c) respectively illustrate the frequently used positional relationships between the signal wire edge (s) and the through-hole (g). The respective diameters (a), (b), and (c) of the circumference where the through-hole (g) is provided with respective signal wire edge (s) as the center are 1.27 mm, 1.9 mm and 2.54 mm. Therefore, we need to prepare plungers (102) that correspond to these distances. That is, three types of plungers (102) with the distances (D) from the center of the plunger (102) illustrated in FIG. 4 to the tip of the second contact stylus (102a), which are the half of said (a), (b), and (c), i.e., 0.635 mm, 0.95 mm, and 1.27 mm, may be used. Needless to say, the number of plungers (102) to be replaced may be increased at any time depending on the needs.

Figure 6:
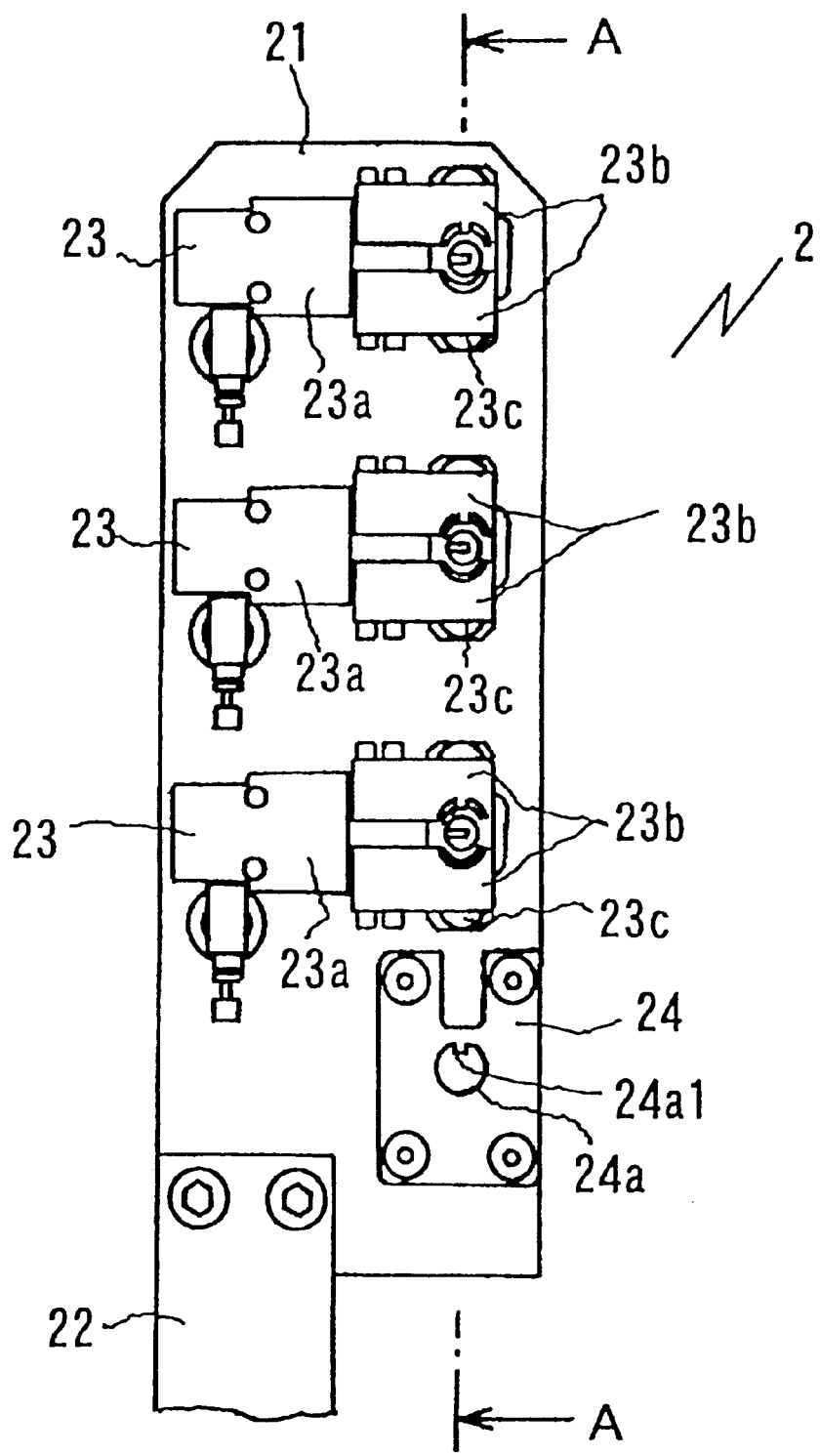
FIG. 6 is a front view of the probe holding unit in accordance with the present invention.
Figure 7:
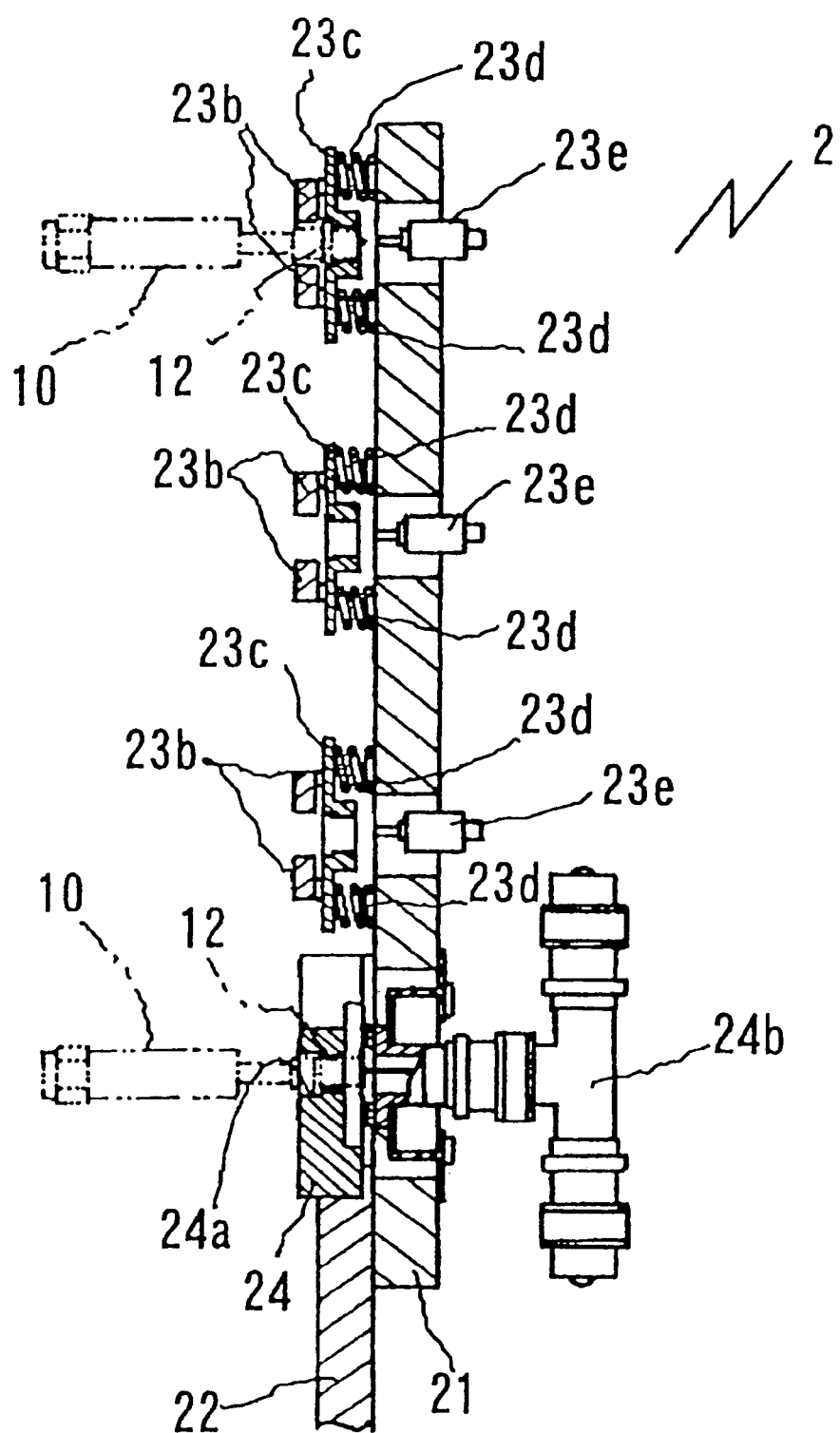
FIG. 7 is a cross-sectional view along A—A in FIG. 6.
Figure 8:
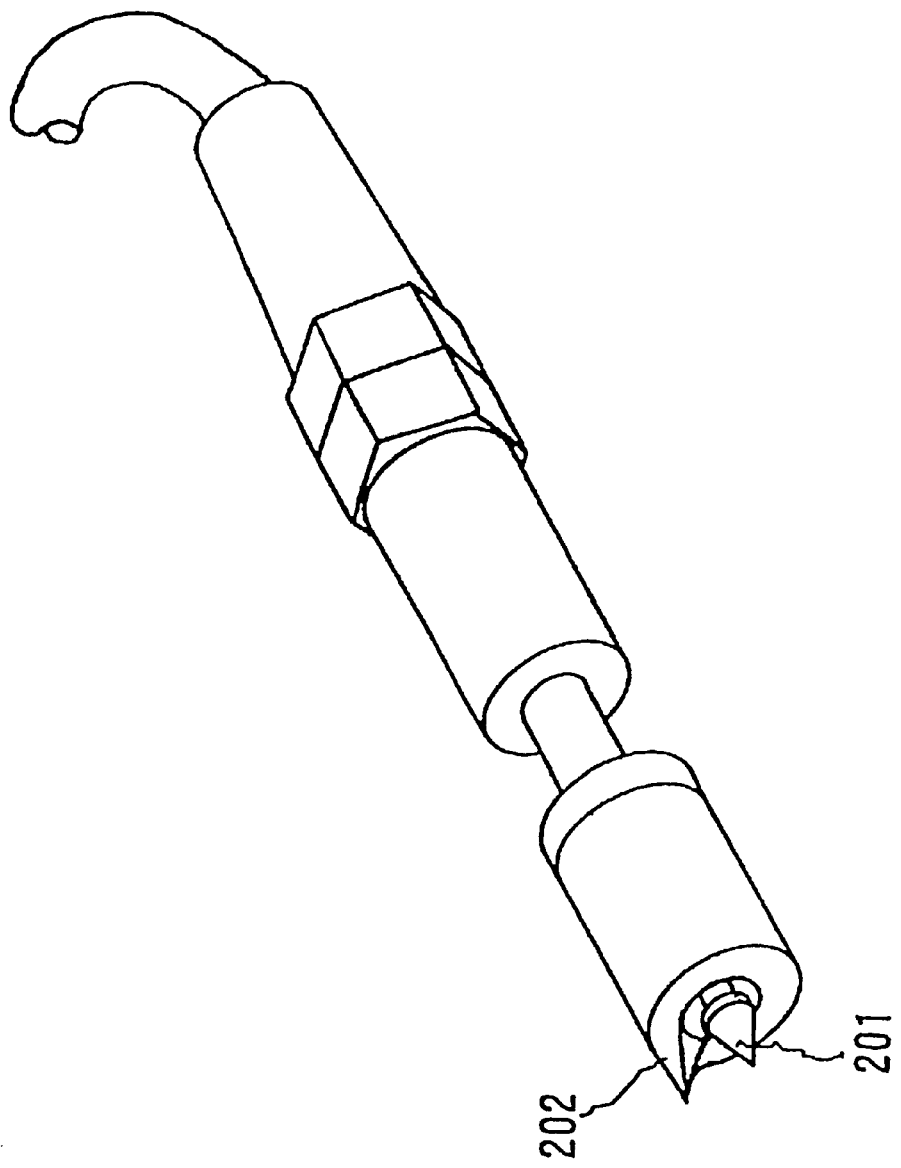
FIG. 8 is an oblique view that illustrates a coaxial probe.

Next, the probe holding unit (2) will be explained in detail. FIG. 6 illustrates a front view of a probe holding unit (2). FIG. 7 illustrates the cross-sectional view along A—A in FIG. 6. The probe holding unit (2) is comprised of a base part (21), a base part fixing plate (22) which fixes the base part (21) to said frame (4), the replacement contact stylus holding parts (23), (23), (23) provided on the base part (21), and a calibration part (24) which is also provided on the base part (21).

Each of the replacement contact stylus holding parts (23) is comprised of an air chuck main body (23a) which opens and closes by controlling an electromagnetic valve which regulates the compressed air fed from a compressor (not shown), contact stylus grasping parts (23b), (23b) which are constituted to grasp or release the peripheral face of the plunger (102) of the coaxial probe (10) with this air chuck main body (23a) as a driving means, a grasping part support plate (23c) which has an opening that can engage with the peripheral face of the plunger (102) and supports the contact stylus grasping parts (23b), (23b) from the bottom, compression springs (23d), (23d) provided between the grasping part support plate (23c) and the base part (21), and a microswitch (23e) which is fixed to the base part (21) and is turned on when the compression springs (23d), (23d) are compressed as much as a predetermined amount on receipt of the force from the plunger (102) while the plunger (102) engages with the grasping part support plate (23c). The air chuck main body (23a) switches the electromagnetic valve each time the microswitch (23e) is turned on, thereby alternately repeating the grasping and releasing of the contact stylus grasping parts (23b), (23b). Although the air chuck main body (23a) that uses the compressed air is used here as the driving means, a driving means that operates on electric power such as a solenoid may be used.

The calibration part (24) is comprised of a reference engaging part (24a) and a reference resistance (24b). The reference engaging part (24a) has an opening that engages with the peripheral face of the plunger (102) including the calibration ring (102c) that has a notch (102c1) provided in the periphery of the plunger (102) when the plunger (102) of the coaxial probe (10) is at a predetermined reference position. As the notch (102c1) of said calibration ring (102c) is formed such that its width becomes narrower from the tip toward the rear edge in the longitudinal direction of the plunger, a convex part (24a1) is provided at a predetermined reference position in the reference engaging part (24a) in a manner that its width becomes wider from the front to the back face so that the convex part (24a1) may fit the notch (102c1). As the notch (102c1) of the calibration ring (102c) is tapered in this manner, the convex part (24a1) fits snugly into the notch (102c1) when the coaxial probe (10) is pushed toward the reference engaging part (24a) with the installation position in the turning direction around the first contact stylus as the central axis set in the vicinity of the reference position. If the coaxial probe (10) is further pushed forward, the plunger (102) may turn such that the notch (102c1) come to engage with the convex part (24a1) completely. Thus, the calibration of the plunger installation position in the turning direction is made.

The reference resistance (24b) is a resistance that has a reference impedance value. When the plunger (102) of the coaxial probe (10) engages with the reference engaging part (24a), it is connected such that the impedance can be measured by means of the first contact stylus (101a) and the second contact stylus (102a) of the coaxial probe (10). Here, by way of example, 28 Ω is used as the reference impedance value.

Finally, the control part (8) will be briefly explained. The control part (8) is comprised of a driving unit to drive all motors of the impedance measuring device (A) and a general computer composed of CPU, RAM, ROM and so on which controls the measurement timing of the measurement unit (16) provided in this driving unit and the probe unit (1). The control part (8) can control the coaxial probe (10) mounted to the probe unit (1) at any position including the axial rotation direction (or angle) by controlling the motors provided in the X-direction rails (5a), (5b), Y-direction rail (6), and probe unit (1). Also, the control part (8) commands the measurement unit (16) to conduct a measurement when the first test probe and the second test probe of the coaxial probe (10) are in contact with the points of measurement on the board (X) to be tested. Then, as the control part (8) stores the circuit pattern data of the board (X) to be tested, the control part (8) controls each motor and measurement unit to test the measurement points on the board to be tested based on a predetermined algorithm.

Next, the operation of the impedance measuring device (A) that has the constitution mentioned above will be explained. It is assumed that the printed wiring board (X) to be measured has all patterns with respect to the distance between the signal wire edges and the through-hole as shown in FIGS. 5 (a), (b), and (c). It is also assumed that the control part (8) has already stored the circuit pattern data of the board (X) to be tested.

First, the coaxial probe (10) is connected to the connector (11) of the probe unit (1). Also, the replacement plungers (102') except for the plunger (102) of the connected coaxial probe (10), are held by the replacement contact stylus holding part (23) of the probe holding unit (2). Since three types of plungers (102) are used in this application mode, two replacement plungers (102') are held by the replacement contact stylus holding part (23). To let the replacement contact stylus holding part (23) hold a plunger (102), the replacement plunger (102') is positioned for engagement and pushed in the grasping part support plate (23c). In this manner the microswitch (23e) is turned on and the contact stylus grasping parts (23b), (23b) automatically closes to grasp the replacement plunger (102') Now, the control part (8) needs to have stored the information in which position each plunger (102) is located, the coaxial probe (10) or the replacement contact stylus holding parts (23), (23), (23). This information may be predetermined or input to the control part (8) after each plunger (102) is set.

Next, the board holding clamps (7), (7) grasp the board (X) to be tested and the measurement is started. The control part (8) first moves the coaxial probe (10) to the place where the calibration part (24) of the probe holding unit (2) is and has the plunger (102) of the coaxial probe (10) engage the reference engaging part (24*a*) of the calibration part (24). In this manner, the turning direction position of the plunger (102) around the first contact stylus (101*a*) as the center of turning is calibrated. Since the first contact stylus (101*a*) and the second contact stylus (102*a*) of the coaxial probe (10) is able to measure the reference resistance (24*b*) at this time, the control part (8) transmits the test signal to the measurement unit (16) and receive the reflected waves. If the setting is correct, no reflected wave will return. Therefore, if there are any reflected waves, the setting of the measurement unit (16) should be adjusted based on the magnitude of the reflected waves.

After that, the measurement of the board (X) to be tested is started. The control part (8) moves the coaxial probe (10) to the point of measurement at which a measurement can be made with the plunger (102) installed on the coaxial probe (10). Then, it controls the turning motor unit (15) of the probe unit (1) to turn the coaxial probe (10) such that the angle made by the first contact stylus (101*a*) and the second contact stylus (102*a*) of the coaxial probe (10) matches the angle made by the signal wire edge and the through-hole at the point of measurement. The amount of turning is precomputed based on the circuit data. When the control of rotational movement is completed, the control part (8) controls the sliding motor unit (14) of the probe unit (1), move the coaxial probe (10) by a predetermined amount toward the tip direction and press the tip to the point of measurement. At this time the compression spring (101*c*) provided in the center probe (101) absorbs the impact shock when the first contact stylus (101*a*) hits the board (X) to be tested. When the first contact stylus (101*a*) of the coaxial probe is in contact with the signal line edge and the second contact stylus is in contact with the through-hole, the control part (8) has the measurement unit (16) measure the impedance of the signal wire in contact. When the measurement is completed, the control part (8) moves back the tip of the coaxial probe (10) from the board to be tested (X) and returns it to its initial position. Furthermore, it also returns the rotational position of the coaxial probe (10) to its initial position. In this manner, the points of measurement that can be measured with the current plunger (102) mounted to the coaxial probe (10) are measured.

When all measurements that can be measured with the current plunger (102) mounted to the coaxial probe (10) are completed, the control part (8) moves the coaxial probe (10) to the front of the empty replacement contact stylus holding part (23) of the probe holding unit (2). In this state the control part (8) moves the coaxial probe (10) toward the tip direction. Then, the plunger (102) located around the tip of the coaxial probe (10) is engaged with the grasping part support plate (23*c*) of the replacement contact stylus holding part (23) and the microswitch (23*e*) is turned on. In this manner, as the electromagnetic valve of the air chuck main body (23*a*) changes over, the contact stylus grasping part (23*b*) closes so that the plunger (102) is grasped. After moving the coaxial probe (10) to a point where the microswitch (23*e*) is turned on, the control part (8) then moves the coaxial probe in the reverse direction. At this time, as the plunger (102) is grasped by the contact stylus grasping part (23*b*), the plunger (102) is detached from the coaxial probe (10) main unit and remains in the replacement contact stylus holding part (23).

Then, the control part (8) moves the coaxial probe (10) without the plunger (102) to the front of the replacement contact stylus holding part (23) where a replacement plunger (102) is held and then moves the coaxial probe (10) toward the tip direction. In this manner, the replacement plunger (102) fits to the outer tube (104) of the coaxial probe (10) where the original plunger (102) used to be put on and then the stopper (105) of the coaxial probe (10) engages with the rear edge opening of the replacement plunger (102). When the coaxial probe (10) moves further toward the tip direction, the microswitch (23*e*) is turned on to make the air chuck main body (23*a*) open and to make the contact stylus grasping parts (23*b*), (23*b*) release the replacement plunger (102). After the control part (8) moves the coaxial probe to the position where the microswitch is turned on, it moves the coaxial probe (10) back in the reverse direction to its initial position. At this time, as the grasping of replacement plunger (102) is released, a new plunger (102) is mounted on the coaxial probe (10). Thus, the replacement of plungers (102) is completed. In this manner, the plunger (102), that is, the contact stylus replacement means to replace the second contact stylus (102*a*) is composed of the means to drive the coaxial probe such as X-direction rails (5*a*), (5*b*) and the Y-direction rail (6), the contact stylus grasping parts (23*b*), (23*b*), the air chuck main body (23*a*) as the driving means that drives these contact stylus grasping parts (23*b*), (23*b*), the control part (8) that controls the driving of the coaxial probe and the microswitch (23*e*) that controls the air chuck main body (23*a*).

When the replacement of plunger (102) is completed, the control part (8), in the same way as mentioned earlier, has the calibration part (24) of the probe holding unit (2) calibrate the plunger turning direction position around the first contact stylus (101*a*) as the center of turning and the measurement unit (16). After that, it measures the points of measurement on the board (X) to be tested that can be measured with the replaced plunger (102). The replacement to the remaining last replacement plunger (102) is further made in the same way as described above. After the calibration of rotational position, etc., the points of measurement on the board (X) to be tested that can be measured with the last plunger (102) are measured. By the operation described above, the impedance of all measurement points is measured.

In this manner, although the board to be tested has more than one kind of distance between the two points for impedance measurement and even though radial or turning direction relation between the two points is varied in many ways, the impedance measurement may be conducted and completed with the impedance measuring device in accordance with the present invention by replacing and turning the second contact stylus around the first contact stylus. Therefore, it is realized that the impedance measurement can be automated with the impedance measuring device in accordance with the present invention.

In said application mode, the second contact stylus (102*a*) is turned around the first contact stylus (101*a*) by turning the entire coaxial probe (10). However, instead of this, for instance, a servomotor for control may be provided on the coaxial probe (10), and only the plunger (102) that contains the second contact stylus (102*a*) may be turned. Furthermore, it is not needed to provide a mechanism to turn the second contact stylus (102*a*) in the probe unit (1). For instance, the probe unit, therefore, may has a mechanism that engages with and turn the plunger (102) including the second contact stylus (102*a*) so that the control part (8) may move the coaxial probe (10) to this mechanism part to have the plunger (102) engaged with and turned by the mechanism when the rotation is needed for a necessary amount of turning.

Also, in this application mode, the plunger (102) is made attachable and detachable so that only the plunger (102)

should be replaced. However, the plunger (102) may be fixed to the coaxial probe (10) and the whole coaxial probe (10) including the plunger (102) may be replaced. That is, as long as the second contact stylus (102*a*) is structurally connected, the range or the size of the part to be replaced is not limited.

Then, in the application mode, the coaxial probe is used for the test probe unit. Any test probe units using a probe other than the coaxial probe may also be used. For instance, the invention may also be applied to a test probe unit which has the conductor leading from the first contact stylus to the signal transmission and reception part of the measurement unit and the conductor leading from the second contact stylus to the ground part of the measurement unit in parallel or twisted relation, as long as the first contact stylus and the second contact stylus are fixed with a certain distance apart during impedance measurement.

What is claimed is:

1. A probe unit of an impedance measuring device for a printed wiring board, that comprises a first and a second contact styli whose tips point to a same direction and may be moved to any place over the printed wiring board to be measured in order to make the first and second contact styli contact certain measuring points on the printed wiring board, the second contact stylus being placed with a predetermined distance from the first contact stylus;

comprising:
a second contact stylus turning means for turning the second contact stylus around the center axis of the first contact stylus.

2. The device of claim 1, wherein the second contact stylus turning means turns the second contact stylus by turning a coaxial probe around the first contact stylus.

3. The device of claim 1, comprising a reference resistor of a reference impedance whereby the reference impedance can be measured by the probe unit.

4. The device of claim 1, further comprising an elastic member that pushes the first contact stylus toward a tip direction of the first contact stylus.

5. The device of claim 1, further comprising a turning position calibration means for calibrating installation position of the second contact stylus in a turning direction around the first contact stylus of the probe unit mounted on the test probe driving means.

6. The device of claim 5, further comprising a ring having a notched part and the center axis of the ring being aligned with the center axis of the first contact stylus, the ring being secured to the second contact stylus, wherein the turning position calibration means comprises a reference engaging part whereby the probe unit including the ring engages the reference engaging part.

7. The device of claim 6, comprising a reference resistor of a reference impedance whereby the reference impedance can be measured by the probe unit when the probe unit engages the reference engaging part.

8. The device of claim 6, wherein the ring having the notched part engaging the reference engaging part is integrally installed with the second contact stylus having the center axis of the ring aligned with the center axis of the first contact stylus.

9. A probe unit of an impedance measuring device for a printed wiring board that comprises a first and a second contact styli whose tips point to a same direction and may be moved to any place over the printed wiring board to be measured in order to make the first and second contact styli contact certain measuring points on the printed wiring board, the second contact stylus being placed with a certain distance from the first contact stylus, said probe unit cooperating with a replacement contact stylus holding means for holding a replacement second contact stylus exchangeable with the second contact stylus; and a contact stylus replacing means for replacing the second contact stylus with the replacement second contact stylus held by the replacement contact stylus holding means.

10. The device of claim 9, wherein the replacement contact stylus holding means comprises at least two contact stylus grasping means for grasping and releasing the second contact stylus by a driving means for the contact stylus grasping means, wherein the contact stylus replacing means comprises the test probe driving means, the contact stylus grasping means, and a driving control means that controls the test probe driving means and the driving means for the contact stylus grasping means.

11. The device of claim 9, comprising a reference resistor of a reference impedance whereby the reference impedance can be measured by the probe unit.

12. The device of claim 9, further comprising an elastic member that pushes the first contact stylus toward a tip direction of the first contact stylus.

13. The device of claim 9, wherein the second contact stylus is formed such that it can be attached to and detached from the first contact stylus in the longitudinal direction of the first contact stylus.

14. The device of claim 9, further comprising a turning position calibration means for calibrating installation position of the second contact stylus in a turning direction around the first contact stylus of the probe unit.

15. The device of claim 14, further comprising a ring having a notched part and the center axis of the ring being aligned with the center axis of the first contact stylus, the ring being secured to the second contact stylus, wherein the turning position calibration means comprises a reference engaging part whereby the probe unit including the ring engages with the reference engaging part.

16. The device of claim 15, comprising a reference resistor of a reference impedance whereby the reference impedance can be measured by the probe unit when the probe unit engages with the reference engaging part.

* * * * *